US011195751B2

(12) United States Patent
Yang et al.

(10) Patent No.: US 11,195,751 B2
(45) Date of Patent: Dec. 7, 2021

(54) BILAYER BARRIER FOR INTERCONNECT AND MEMORY STRUCTURES FORMED IN THE BEOL

(71) Applicant: International Business Machines Corporation, Armonk, NY (US)

(72) Inventors: Chih-Chao Yang, Glenmont, NY (US); Baozhen Li, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 16/570,648

(22) Filed: Sep. 13, 2019

(65) Prior Publication Data
US 2021/0082751 A1 Mar. 18, 2021

(51) Int. Cl.
*H01L 21/768* (2006.01)
*H01L 27/11507* (2017.01)
(Continued)

(52) U.S. Cl.
CPC .... *H01L 21/76849* (2013.01); *H01L 21/7684* (2013.01); *H01L 21/76885* (2013.01);
(Continued)

(58) Field of Classification Search
CPC ......... H01L 21/76849; H01L 21/76886; H01L 21/7684; H01L 21/76885; H01L 23/5226;
(Continued)

(56) References Cited

U.S. PATENT DOCUMENTS 3,808,680 A 5/1974 Lafrate et al.
5,691,238 A 11/1997 Avanzino et al.
(Continued)

FOREIGN PATENT DOCUMENTS

| JP | 01-183116 A | 7/1989 |
| KR | 10-0517350 B1 | 9/2005 |
| WO | 2015026390 A1 | 2/2015 |

OTHER PUBLICATIONS

List of IBM Patents or Patent Applications Treated as Related dated Oct. 29, 2019, 2 pages.
(Continued)

*Primary Examiner* — Caleen O Sullivan
(74) *Attorney, Agent, or Firm* — Scully, Scott, Murphy & Presser, P.C.; L. Jeffrey Kelly, Esq.

(57) ABSTRACT

An interconnect or memory structure is provided that includes a first electrically conductive structure having a concave upper surface embedded in a first interconnect dielectric material layer. A first metal-containing cap contacts the concave upper surface of the first electrically conductive structure. The first metal-containing cap has a topmost surface that is coplanar with a topmost surface of the first interconnect dielectric material layer. A second metal-containing cap having a planar bottommost surface contacts the topmost surface of the first metal-containing cap. A metal-containing structure having a planar bottommost surface contacts a planar topmost surface of the second metal-containing cap. A second electrically conductive structure contacts a planar topmost surface of the metal-containing structure, and a second interconnect dielectric material layer is present on the first interconnect dielectric material layer and is located laterally adjacent to second metal-containing cap, the metal-containing structure, and the second electrically conductive structure.

10 Claims, 3 Drawing Sheets

(51) Int. Cl.
- *H01L 43/12* (2006.01)
- *H01L 45/00* (2006.01)
- *H01L 27/24* (2006.01)
- *H01L 27/22* (2006.01)
- *H01L 23/522* (2006.01)

(52) U.S. Cl.
CPC .... *H01L 21/76886* (2013.01); *H01L 23/5226* (2013.01); *H01L 27/11507* (2013.01); *H01L 27/222* (2013.01); *H01L 27/2463* (2013.01); *H01L 43/12* (2013.01); *H01L 45/1675* (2013.01)

(58) Field of Classification Search
CPC . H01L 43/12; H01L 45/1675; H01L 27/2463; H01L 27/222; H01L 27/11507
USPC .......................................................... 257/4
See application file for complete search history.

(56) References Cited

U.S. PATENT DOCUMENTS

| | | |
|---|---|---|
| 6,207,552 B1 | 3/2001 | Wang et al. |
| 6,225,223 B1 | 5/2001 | Liu et al. |
| 6,251,786 B1 | 6/2001 | Zhou et al. |
| 6,596,580 B2 | 7/2003 | Lian et al. |
| 7,247,565 B2 | 7/2007 | Keum |
| 8,357,609 B2 | 1/2013 | Ryan |
| 8,866,242 B2 | 10/2014 | Li et al. |
| 9,281,239 B2 | 3/2016 | Daamen et al. |
| 9,865,649 B2 | 1/2018 | Tan et al. |
| 9,893,120 B2 | 2/2018 | Chuang et al. |
| 9,893,278 B1 | 2/2018 | Chuang et al. |
| 10,096,769 B2 | 10/2018 | Bhosale et al. |
| 2001/0050385 A1 | 12/2001 | Kotecki et al. |
| 2002/155693 A1 | 10/2002 | Hong et al. |
| 2008/0293165 A1 | 11/2008 | Ranjan et al. |
| 2010/0038617 A1 | 2/2010 | Nakajima et al. |
| 2010/0301449 A1 | 12/2010 | Scheurlein et al. |
| 2012/0080793 A1 | 4/2012 | Danek et al. |
| 2013/0328208 A1* | 12/2013 | Holmes ............. H01L 21/76831 257/774 |
| 2015/0171314 A1 | 6/2015 | Li et al. |
| 2017/0018704 A1 | 1/2017 | Chuang et al. |
| 2017/0062707 A1 | 3/2017 | Annunziata et al. |
| 2017/0069684 A1 | 3/2017 | Suh et al. |
| 2017/0170386 A1 | 6/2017 | Chuang et al. |
| 2017/0194557 A1 | 7/2017 | Chuang et al. |
| 2018/0114719 A1 | 4/2018 | Briggs et al. |
| 2018/0197915 A1 | 7/2018 | Briggs et al. |
| 2018/0261759 A1 | 9/2018 | Bhosale et al. |
| 2018/0351081 A1 | 12/2018 | Sung et al. |
| 2018/0374895 A1 | 12/2018 | Hsu et al. |
| 2019/0058109 A1 | 2/2019 | Chen et al. |
| 2019/0067092 A1 | 2/2019 | Murray et al. |
| 2019/0393409 A1* | 12/2019 | Maniscalco ........... H01L 23/528 |
| 2021/0028107 A1* | 1/2021 | Yang ................. H01L 21/76802 |

OTHER PUBLICATIONS

Office Action dated Oct. 18, 2021 received in U.S. Appl. No. 16/522,233, Copy Not Enclosed.

* cited by examiner

BILAYER BARRIER FOR INTERCONNECT AND MEMORY STRUCTURES FORMED IN THE BEOL

BACKGROUND

The present application relates to back-end-of-the-line (BEOL) technology, and more particularly to an interconnect structure or a memory structure that is formed in the BEOL.

One challenge in forming interconnect structures or memory structures in the BEOL is that various amounts of recessing of the electrically conductive structures located in the same interconnect level typically occurs. Such recessing can lead to topography issues within the interconnect structures or memory structures that are formed in the BEOL. One example is the variation on depth of focus in optical lithography. Another example is an undesired embedded film post planarization. A further example is that a flat and smooth surface is required as a foundation/substrate prior to memory stack deposition for performance and yield control. There is a need to address this topography issue in providing interconnect structures or memory structures in the BEOL.

SUMMARY

In one aspect of the present application, a structure (i.e., an interconnect structure or a memory structure) is formed in the BEOL. In one embodiment, the structure includes a first electrically conductive structure having a concave upper surface embedded in a first interconnect dielectric material layer. A first metal-containing cap having a convex bottom surface directly contacts the concave upper surface of the first electrically conductive structure. The first metal-containing cap has a topmost surface that is coplanar with a topmost surface of the first interconnect dielectric material layer. A second metal-containing cap having a planar bottommost surface directly contacts the topmost surface of the first metal-containing cap. A metal-containing structure having a planar bottommost surface directly contacts a planar topmost surface of the second metal-containing cap. A second electrically conductive structure contacts a planar topmost surface of the metal-containing structure, and a second interconnect dielectric material layer is present on the first interconnect dielectric material layer and is located laterally adjacent to second metal-containing cap, the metal-containing structure, and the second electrically conductive structure. Collectively, the first and second metal-containing caps provide a bilayer barrier for the metal-containing structure.

In another aspect of the present application, a method of forming a structure i.e., an interconnect structure or a memory structure, in the BEOL is provided. In one embodiment, the method includes forming a first electrically conductive structure having a concave upper surface and embedded in a first interconnect dielectric material layer. A first metal-containing cap is then formed on the concave upper surface of the first electrically conductive structure, wherein the first metal-containing cap has a topmost surface that is coplanar with a topmost surface of the first interconnect dielectric material layer. A second metal-containing cap layer is then formed on the first metal-containing cap and the topmost surface of the first interconnect dielectric material layer. Next, a metal-containing layer is formed on a planar topmost surface of the second metal-containing cap layer. The metal-containing layer and the second metal-containing cap layer are then patterned to provide a patterned structure that includes a remaining portion of the metal-containing layer and a remaining portion of the second metal-containing cap layer on the topmost surface of the first metal-containing cap. A second interconnect dielectric material layer is then formed laterally adjacent to, and atop, the patterned structure. Next, a second electrically conductive structure is formed in the second interconnect dielectric material layer, wherein the second electrically conductive structure contacts the patterned structure.

DETAILED DESCRIPTION

Figure 2:
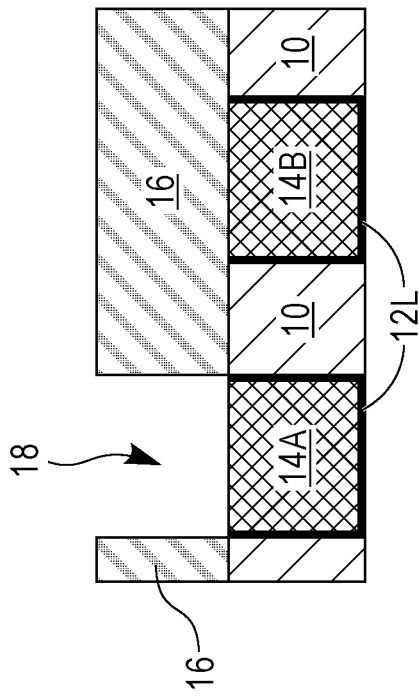
FIG. 2 is a cross sectional view of the exemplary structure of FIG. 1 after forming a hard mask on a surface of the first interconnect dielectric material layer, wherein the hard mask contains an opening that physically exposes the at least one first electrically conductive structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
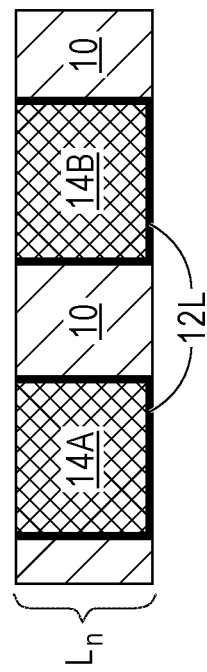
FIG. 1 is a cross sectional view of an exemplary structure that can be employed in accordance with an embodiment of the present application and including at least one first electrically conductive structure embedded in a first interconnect dielectric material layer.

Referring first to FIG. 1, there is illustrated an exemplary structure that can be employed in accordance with an embodiment of the present application. The exemplary structure of FIG. 1 includes at least one first electrically conductive structure 14A embedded in a first interconnect dielectric material layer 10. In the embodiment illustrated in FIG. 1, element 14B represents another first electrically conductive structure that can be embedded in the first interconnect dielectric material layer 10. Although the present application describes and illustrates two first electrically conductive structures (14A, 14B) embedded in the first interconnect dielectric material layer 10, the present application contemplates an embodiment in which only one first electrically conductive structure (i.e., first electrically conductive structure 14A) is present in the first interconnect dielectric material layer 10 and embodiments in which more than two first electrically conductive structures are present in the first interconnect dielectric material layer 10.

In some embodiments, and as shown in FIG. 1, a first diffusion barrier liner 12L is located on the sidewalls and bottommost surface of each first electrically conductive structure 14A, 14B. The first electrically conductive structures 14A, 14B have a topmost surface that is coplanar with a topmost surface of the first interconnect dielectric material layer 10, and if present, a topmost surface of the first diffusion barrier liner 12L.

Collectively, the first interconnect dielectric material layer 10, the first electrically conductive structures 14A, 14B and, if present, the first diffusion barrier liner 12L provide a lower (or first) interconnect level, $L_n$. In accordance with the present application, n is an integer starting from 1. Although not shown, at least one other interconnect level, and/or middle-of-line (MOL) level and/or a front-end-of-the-line structure is(are) located beneath the lower (or first) interconnect level, $L_n$. The front-end-of-the-line structure includes a semiconductor substrate that contains a plurality of semiconductor devices formed therein or thereupon. The MOL level includes an MOL dielectric material having at least one contact structure formed therein.

The first interconnect dielectric material layer 10 can be composed of an inorganic dielectric material or an organic dielectric material. In some embodiments, the first interconnect dielectric material layer 10 may be porous. In other embodiments, the first interconnect dielectric material layer 10 may be non-porous. Examples of suitable dielectric materials that may be employed as the first interconnect dielectric material layer 10 include, but are not limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The first interconnect dielectric material layer 10 can have a dielectric constant (all dielectric constants mentioned herein are measured relative to a vacuum, unless otherwise stated) that is about 4.0 or less. In one embodiment, the first interconnect dielectric material layer 10 has a dielectric constant of 2.8 or less. These dielectrics generally having a lower parasitic cross talk as compared to dielectric materials whose dielectric constant is greater than 4.0.

The first interconnect dielectric material layer 10 can be formed by a deposition process such as, for example, chemical vapor deposition (CVD), plasma enhanced chemical vapor deposition (PECVD) or spin-on coating. The first interconnect dielectric material layer 10 can have a thickness from 50 nm to 250 nm. Other thicknesses that are lesser than 50 nm, and greater than 250 nm can also be employed in the present application.

After providing the first interconnect dielectric material layer 10, at least one opening (not shown) is formed into the first interconnect dielectric material layer 10; each opening will house a first electrically conductive structure 14A, 14B and, if present, the first diffusion barrier liner 12L. In some embodiments, the at least one opening in the first interconnect dielectric material layer 10 is typically a via opening. The at least one via opening can be formed by lithography and etching. In other embodiments, the at least one opening that is formed in the first interconnect dielectric material layer 10 is a line opening. The line opening can be formed by lithography and etching. In yet further embodiments, the at least one opening that is formed in the first interconnect dielectric material layer 10 is a combined via/line opening. The combined via/line opening can be formed utilizing two lithographic and etching steps.

When present, a diffusion barrier material layer is then formed in each opening and on a topmost surface of the first interconnect dielectric material layer 10. The diffusion barrier material layer can be composed of Ta, TaN, Ti, TiN, Ru, RuN, RuTa, RuTaN, W, WN or any other material that can serve as a barrier to prevent a conductive material from diffusing there through. The thickness of the diffusion barrier material layer can vary depending on the deposition process used as well as the material employed. In some embodiments, the diffusion barrier material layer may have a thickness from 2 nm to 50 nm; although other thicknesses for the diffusion barrier material layer are contemplated and can be employed in the present application as long as the diffusion barrier material layer does not entirety fill the opening that is formed into the first interconnect dielectric material layer 10. The diffusion barrier material layer can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the diffusion barrier material layer. In some embodiments, the optional plating seed layer is not needed. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

Next, an electrically conductive metal or metal alloy layer is formed into each opening and, if present, atop the diffusion barrier material layer. The electrically conductive metal or metal alloy layer provides the first electrically conductive structures 14A, 14B of the present application. The electrically conductive metal or metal alloy layer can be composed of copper (Cu), aluminum (Al), tungsten (W), or an alloy thereof such as, for example, a Cu—Al alloy. The electrically conductive metal or metal alloy layer can be formed utilizing a deposition process such as, for example, CVD, PECVD, sputtering, chemical solution deposition or plating. In one embodiment, a bottom-up plating process is employed in forming the electrically conductive metal or metal alloy layer. In some embodiments, the electrically conductive metal or metal alloy layer is formed above the topmost surface of the first interconnect dielectric material layer 10.

Following the deposition of the electrically conductive metal or metal alloy layer, a planarization process such as, for example, chemical mechanical polishing (CMP) and/or grinding, can be used to remove all electrically conductive metal or metal alloy (i.e., overburden material) that is present outside each of the openings forming the first electrically conductive structures 14A, 14B. In the illustrated embodiment, the planarization stops on a topmost surface of the first interconnect dielectric material layer 10. Thus, and if present, the planarization process also removes the diffusion barrier material from the topmost surface of the first interconnect dielectric material layer 10. The remaining portion of the diffusion barrier material layer that is present in the at least one opening is referred to herein as the first diffusion barrier liner 12L, while the remaining electrically conductive metal or metal alloy layer that is present in the one opening may be referred to as the first electrically conductive structure 14A, 14B.

Referring now to FIG. 2, there is illustrated the exemplary structure of FIG. 1 after forming a hard mask 16 on a surface of the first interconnect dielectric material layer 10, wherein the hard mask 16 contains an opening 18 that physically exposes the at least one first electrically conductive structure, e.g., first electrically conductive structure 14A. In the illustrated embodiment, the first electrically conductive structure 14B that is present in the first interconnect dielectric material layer 10 is not physically exposed. The number of physically exposed and non-physically exposed first electrically conductive structures may vary so long as at least one of the first electrically conductive structures, e.g., first electrically conductive structure 14A, is physically exposed. In some embodiments, to be explained in greater detail herein below, this step of the present application can be omitted.

When present, hard mask 16 is composed of a hard mask material. The hard mask material that provides hard mask 16 is compositionally different from the interconnect dielectric material that provides the first interconnect dielectric material layer 10. Illustrative examples of hard mask materials that provide the hard mask 16 include, but are not limited to, silicon dioxide, silicon nitride and/or silicon oxynitride.

The hard mask 16 can be formed by first forming a layer of hard mask material, as defined above, on the first interconnect dielectric material layer 10. The layer of hard mask material is a continuous layer that covers the entirety of the first interconnect dielectric material layer 10 including the first electrically conductive structures 14A, 14B and, if present, the first diffusion barrier liners 12L. The layer of hard mask material can be formed utilizing a deposition process such as, for example, chemical vapor deposition (CVD), plasma enhanced chemical vapor deposition (PECVD), or physical vapor deposition (PVD). The layer of hard mask material can have a thickness from 20 nm to 200 nm. Although thicknesses for the layer of hard mask material are contemplated and can be used in the present application as the thickness of the layer of hard mask material.

The layer of hard mask material is then patterned by lithography and etching to provide opening 18 that physically exposes the at least one first electrically conductive structure, e.g., first electrically conductive structure 14A.

Figure 3:
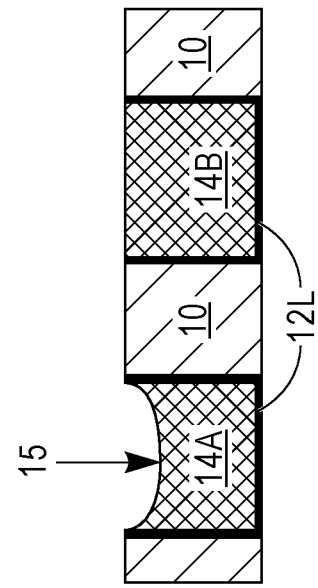
FIG. 3 is a cross sectional view of the exemplary structure of FIG. 2 after recessing the physically exposed at least one first electrically conductive structure and removing the hard mask.

Referring now to FIG. 3, there is illustrated the exemplary structure of FIG. 2 after recessing the physically exposed at least one first electrically conductive structure (e.g., first electrically conductive structure 14A) and removing the hard mask 16. The recessing may be performed utilizing an etching process that is selective in removing the electrically conductive metal or metal alloy that provides the physically exposed first electrically conductive structure (e.g., first electrically conductive structure 14A). The recessing provides a recessed surface 15 to the physically exposed at least one first electrically conductive structure (e.g., first electrically conductive structure 14A); the non-recessed first electrically conductive structures (e.g., first electrically conductive structure 14B) do not contain the recessed surface.

The recessed surface 15 of the physically exposed at least one first electrically conductive structure (e.g., first electrically conductive structure 14A) is a concave upper surface (that is the upper surface of the recessed bottom electrode 14A curves inward to provide a first electrically conductive structure 14A that is thinner in the middle than on the edges) as shown in FIG. 3, while the non-recessed first electrically conductive structures (e.g., first electrically conductive structure 14B) maintain a planar topmost surface.

In some embodiments, and during the removal of the overburdened conductive metal or metal alloy that provides the first electrically conductive structures 14A, 14B, the planarization process itself can provide the recessed surface 15 (i.e., the concave upper surface) shown in FIG. 3. In such an embodiment, the at least one least one first electrically conductive structure (e.g., first electrically conductive structure 14A) that is to be recessed is connected to a large electrically conductive pad of the front-end-of-the-line structure; first electrically conductive structure 14B is floating (not connected to an electrically conductive pad of the front-end-of-the-line structure) in the illustrated embodiment. The first electrically conductive structures (e.g., first electrically conductive structure 14A) that are connected to the underlying circuitry are recessed by the planarization process that removes the overburdened electrically conductive metal or metal alloy, while the first electrically conductive structures that are floating are not recessed by the planarization process that removes the overburdened electrically conductive metal or metal alloy.

Figure 4:
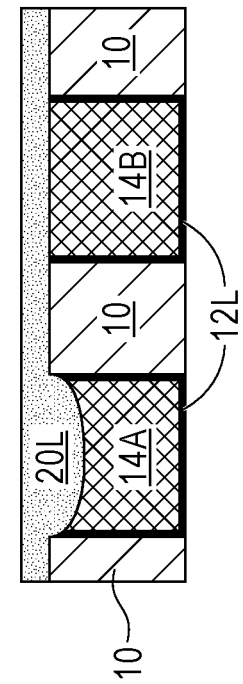
FIG. 4 is a cross sectional view of the exemplary structure of FIG. 3 after forming a first metal-containing cap layer on the recessed surface of the at least one first electrically conductive structure and on a topmost surface of the first interconnect dielectric material layer.

Referring now to FIG. 4, there is illustrated the exemplary structure of FIG. 3 after forming a first metal-containing cap layer 20L on the recessed surface 15 of the at least one first electrically conductive structure (e.g., first electrically conductive structure 14A) and on a topmost surface of the first interconnect dielectric material layer 10; the first metal-containing cap layer 20L is also present on the planar topmost surface of each non-recessed first electrically conductive structure (e.g., first electrically conductive structure 14B). As is shown in FIG. 4, the first metal-containing cap layer 20L directly contacts the recessed surface 15 (i.e., concave upper surface) of the at least one first electrically conductive structure (e.g., first electrically conductive structure 14A), the topmost surface of the first interconnect dielectric material layer 10, and the planar topmost surface of the non-recessed first electrically conductive structure (e.g., first electrically conductive structure 14B).

The first metal-containing cap layer 20L is composed of a metal such as, for example, Ta, Ti, W, Co, Ru, or Rh, a metal nitride such as, for example, TaN, TiN, WN, CoN, RuN or RhN, or alloys of said metals (e.g., Ta and one of Ti, W, Co, Ru, or Rh; Ti and one of Ta, W, Co, Ru, or Rh; W and one of Ta, Ti, Co, Ru or Rh; Co and one of Ta, Ti, W, Ru or Rh; Ru and one of Ta, Ti, W, Co, or Rh; of Rh and one of Ta, Ti, W, Co, or Ru). The first metal-containing cap layer 20L is compositionally different from the underlying first electrically conductive structures 14A, 14B.

The first metal-containing cap layer 20L can be formed by a deposition process such as, for example, chemical vapor deposition (CVD), plasma enhanced chemical deposition (PECVD), physical vapor deposition (PVD) or atomic layer deposition (ALD). In some embodiments, a planarization process such as, for example, CMP and/or grinding, follows the deposition step. At this junction of the present application, the first metal-containing cap layer 20L has a topmost surface which extends above the topmost surface of the first interconnect dielectric material layer 10 as is shown, for example, in FIG. 4.

Figure 5:
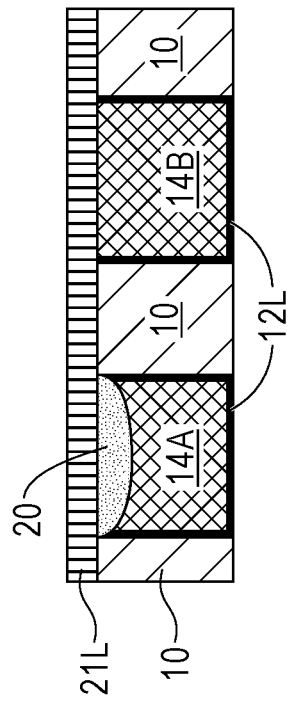
FIG. 5 is a cross sectional view of the exemplary structure of FIG. 4 after removing the first metal-containing cap layer from the topmost surface of the first interconnect dielectric material layer, while maintaining a portion of the first metal-containing cap layer on the recessed surface of the at least one first electrically conductive structure.

Referring now to FIG. 5, there is illustrated the exemplary structure of FIG. 4 after removing the first metal-containing cap layer 20L from the topmost surface of the first interconnect dielectric material layer 10, while maintaining a portion of the first metal-containing cap layer 20L on the recessed surface 15 of the at least one first electrically conductive structure 14A. The maintained portion of the first metal-containing cap layer 20L can be referred to herein as a first metal-containing cap 20. The removal of the first metal-containing cap layer 20L from the topmost surface of the first interconnect dielectric material layer 10 can be performed utilizing a planarization process including, for example, chemical mechanical polishing (CMP) and/or grinding. No first metal-containing cap 20 is present on the another first electrically conductive structure 14B.

The first metal-containing cap 20 has a convex bottom surface that directly contacts the recessed surface 15 (i.e., concave upper surface) of the first electrically conductive structure 14A and a topmost surface that is coplanar with a topmost surface of the first interconnect dielectric material layer 10. The topmost surface of the first metal-containing cap 20 is planar.

Since the first metal-containing cap 20 is formed utilizing a planarization process such as for example, chemical mechanical polishing (CMP), planarization impurities such as, for example, C impurities can be introduced into an upper portion of the first metal-containing cap 20. A planarization impurity is an unwanted element that is introduced into an upper portion of a material following a planarization process. The unwanted element is a component of the planarization process itself. Interaction between the planarization introduced element (i.e., impurities) and the later deposit metal containing layer 22 in FIG. 7 will impact the final device performance. Another concern of the planarization-finalized structure is the variation of the final metal-containing cap layer 20 thickness. Compared to control of less than 2 nm variation from most deposition techniques, control of variation from most planarization are above 10 nm.

Figure 6:
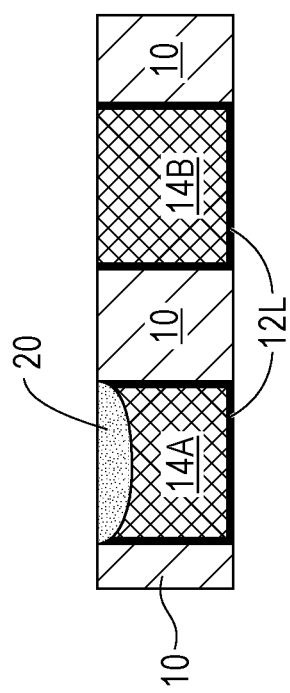
FIG. 6 is a cross sectional view of the exemplary structure of FIG. 5 after forming a second metal-containing cap layer.

Referring now to FIG. 6, there is illustrated the exemplary structure of FIG. 5 after forming a second metal-containing cap layer 21L. The second metal-containing cap layer 21L is formed on physically exposed portions of the topmost surface of the first interconnect dielectric material layer 10, the topmost surface of the first metal-containing cap 20, the topmost surface of the another first electrically conductive structure 14B, and, if present, the topmost surface of the diffusion barrier liner 12L.

The second metal-containing cap layer 21L is composed of a metal such as, for example, Ta, Ti, W, Co, Ru, or Rh, a metal nitride such as, for example, TaN, TiN, WN, CoN, RuN or RhN, or alloys of said metals (e.g., Ta and one of Ti, W, Co, Ru, or Rh; Ti and one of Ta, W, Co, Ru, or Rh; W and one of Ta, Ti, Co, Ru or Rh; Co and one of Ta, Ti, W, Ru or Rh; Ru and one of Ta, Ti, W, Co, or Rh; of Rh and one of Ta, Ti, W, Co, or Ru). In some embodiments, the second metal-containing cap layer 21L is compositionally different from the first metal-containing cap layer 20L (and thus the first metal-containing cap 20) such that a material interface is present between the second metal-containing cap layer 21L and the first metal-containing cap 20. In other embodiments, the metal-containing cap layer 21L is compositionally the same as the first metal-containing cap layer 20L (and thus the first metal-containing cap 20). In such an embodiment, no material interface exists between the second metal-containing cap layer 21L and the first metal-containing cap 20.

The second metal-containing cap layer 21L can be formed by a deposition process such as, for example, chemical vapor deposition (CVD), plasma enhanced chemical deposition (PECVD), physical vapor deposition (PVD) or atomic layer deposition (ALD). In accordance with the present application, no CMP or like planarization process is performed on the second metal-containing cap layer 21L as such no planarization impurities such as, for example, C impurities, are introduced into an upper portion of the second metal-containing cap layer 21L. This allows for providing a planarization impurity free surface to the second metal-containing cap layer 21L in which a subsequently metal-containing layer 22 can be formed.

Figure 7:
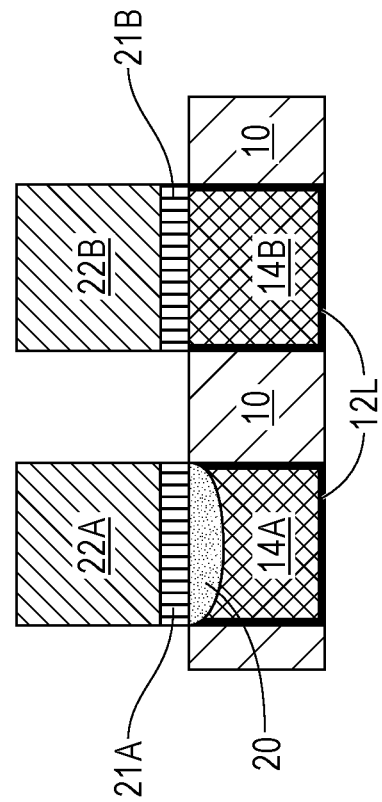
FIG. 7 is a cross sectional view of the exemplary structure of FIG. 6 after forming a metal-containing layer on the second metal-containing cap layer.

Referring now to FIG. 7, there is illustrated the exemplary structure of FIG. 6 after forming a metal-containing layer 22 on the second metal-containing cap layer 21L. The metal-containing layer 22 that is employed in the present application is composed of at least one layer of an electrically conductive metal-containing material. The metal-containing layer 22 can be formed by depositing a layer of the electrically conductive metal-containing material or depositing a material stack of electrically conductive metal-containing materials. In some embodiments, the deposition of the metal-containing layer 22 occurs within the same reactor chamber as the deposition of the second metal-containing cap layer 21L. In such an embodiment, a vacuum can be maintained between the deposition of the second metal-containing cap layer 21L and the metal-containing layer 22.

It is noted that no planarization impurities are present at the interface that is formed between the metal-containing layer 22 and the second metal-containing cap layer 21L. The absence of planarization impurities at the interface that is formed between the metal-containing layer 22 and the second metal-containing cap layer 21L can provide interconnect structures and memory structures that have improved properties such as, for example, lower contact resistance and tighter magnetic resistance distribution.

In one embodiment, the metal-containing layer 22 is composed of one of the electrically conductive metals or metal alloys as mentioned above for the first electrically conductive structure 14A, 14B. In another embodiment, the metal-containing layer 22 is composed of a stack including one of the electrically conductive metals or metal alloys as mentioned above for the first electrically conductive structure 14A, 14B. In yet a further embodiment, the metal-containing layer 22 is composed of a memory stack that can be used as a non-volatile memory device such as, for example, a ferroelectric memory (FE) device, a resistive random access memory (ReRAM) device, a magnetoresistive random access memory (MRAM) device, or a phase change random access memory (PRAM) device.

A FE memory device is a random access memory similar in construction to a DRAM by using a ferroelectric layer instead of a dielectric layer to achieved non-volatility. FE memory devices typically include a material stack of, from bottom to top, a bottom electrode, a ferroelectric layer, and a top electrode. Thus, and in one embodiment of the present application, the metal-containing layer 22 can be an electrically conductive metal-containing material stack of a bottom electrode, a ferroelectric layer, and a top electrode. The bottom and top electrodes may be composed of a metal or metal nitride. For example, TiN may be used as the material for the bottom electrode and/or top electrode. The ferroelectric layer is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ ($0.1 \leq x \leq 1$), or crystalline $HfO_2$ with, or without, a doping element selected from Zr, Al, Ca, Ce, Dy, Er, Gd, Ge, La, Sc, Si, Sr, Sn, C, N, and Y.

A ReRAM device is a random access memory that typically includes a material stack of, from bottom to top, a bottom electrode, a metal oxide that can exhibit a change in electron localization, and a top electrode. Thus, and in one embodiment of the present application, the metal-containing layer 22 can be an electrically conductive metal-containing material stack of a bottom electrode, a ferroelectric layer, and a top electrode. The bottom and top electrodes may be composed of a metal or metal nitride. For example, TiN may be used as the material for the bottom and/or top electrode. The metal oxide may include oxides of nickel, zirconium, hafnium, iron, or copper.

A MRAM device is a random access memory that includes a magnetic tunnel junction (MTJ) structure. The magnetic tunnel junction (MTJ) structure may include a magnetic reference layer, a tunnel barrier, and a magnetic free layer. The magnetic reference layer has a fixed magnetization. The magnetic reference layer may be composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the MTJ structure is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The magnetic free layer of the MTJ structure is composed of at least one magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron.

A PRAM device is a random access memory that typically includes a material stack of, from bottom to top, a bottom electrode, a phase change memory material that exhibits a change in atomic order (from crystalline to amorphous or vice versa), and a top electrode. Thus, and in one embodiment of the present application, the metal-containing layer is an electrically conductive metal-containing material stack of a bottom electrode, a ferroelectric layer, and a top electrode. The bottom electrode and top electrode may be composed of a metal or metal nitride. For example, TiN may be used as the material for the bottom and/or top electrode. The phase change memory material may include a chalcogenide glass such as, for example, $Ge_2Sb_2Te_5$ or $Ge_2Bi_2Te_6$.

Figure 8:
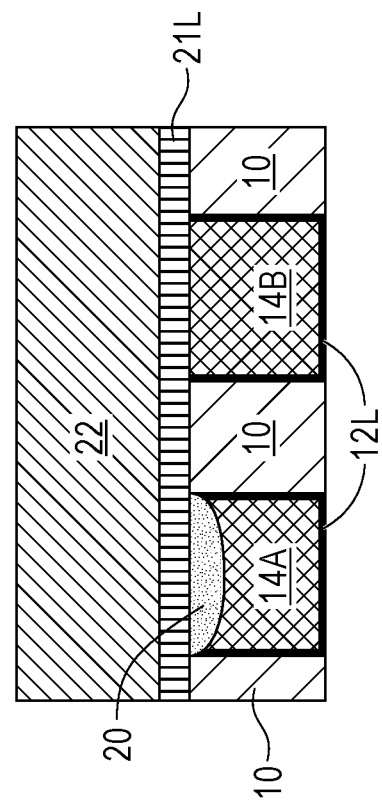
FIG. 8 is a cross sectional view of the exemplary structure of FIG. 7 after patterning the metal-containing layer and the second metal-containing cap layer to provide a patterned structure that includes a remaining portion of the metal-containing layer and a remaining portion of the second metal-containing cap layer on the remaining portion of the first metal-containing cap layer that is present on the recessed surface of the at least one first electrically conductive structure.

Referring now to FIG. 8, there is illustrated the exemplary structure of FIG. 7 after patterning the metal-containing layer 22 and the second metal-containing cap layer 21L to provide a patterned structure that includes a remaining portion of the metal-containing layer 22 (hereinafter "metal-containing structure") and a remaining portion of the second metal-containing cap layer 21L (hereinafter second "metal-containing cap") located on the first metal-containing cap 20 that is present on the recessed surface 15 of the at least one first electrically conductive structure (e.g., first electrically conductive structure 14A). In the embodiment illustrated in FIG. 8, a patterned structure including metal-containing structure 22A and second metal-containing cap 21A is formed upon first metal-containing cap 20 that is located on the recessed surface 15 (i.e., concave upper surface) of the first electrically conductive structure 14A, while another patterned structure including metal-containing structure 22B and another second metal-containing cap 21B is located on the planar topmost surface of the first electrically conductive structure 14B. In the present application, both second metal-containing caps 21A, 21B have a planar bottommost surface and a planar topmost surface.

In the illustrated embodiment, the two patterned structures (i.e. 21A, 22A and 21B, 22B) are spaced apart from each other. Each component of the patterned structures, i.e., the metal-containing structure and the second metal-containing cap has sidewall surfaces that are vertical aligned to each other.

The patterning of the patterning the metal-containing layer 22 and the second metal-containing cap layer 21L can include lithography and etching. The etching may include one or more metal etching process, such as, for example, one or more reactive ion etching processes.

It is noted that the interface that is present between each metal containing structure (i.e., 22A or 22B) and an underlying second metal-containing cap (21A or 21B) lacks any planarization impurities such as, for example, C impurities. Thus, the integrity of the interface between the metal containing structures and the second metal-containing cap is maintained. Planarization impurities would however be present at the interface between the first metal-containing cap 20 and the second metal-containing cap 21A.

As is shown in FIG. 8, the second metal-containing cap 21A has a planar bottommost surface that is in direct physical contact with a topmost (planar) surface of the first metal-containing cap 20 that is located on the recessed surface 15 (i.e., concave upper surface) of the recessed first electrically conductive structure 14A. The metal-containing structure 22A has a planar topmost surface and a planar bottommost that is in direct physical contact with a planar topmost surface of the second metal-containing cap 21A. The another second metal-containing cap 21B has a planar bottommost surface that is in direct physical contact with the planar topmost surface of the non-recessed first electrically conductive structure 14B. The metal-containing structure 22B has a planar topmost surface and a planar bottommost that is in direct physical contact with the planar topmost surface of the another second metal-containing cap 21B.

As is further shown in FIG. 8, the planar topmost surface of second metal-containing cap 21A is coplanar with the planar topmost surface of the another second metal-containing cap 21B, the planar bottommost surface of metal-containing structure 22A is coplanar with the planar bottommost surface of the another metal-containing structure 22B and the planar topmost surface of metal-containing structure 22A is coplanar with the planar topmost surface of the another metal-containing structure 22B. Topography issues are thus circumvented in the exemplary structure shown in FIG. 8.

Figure 9:
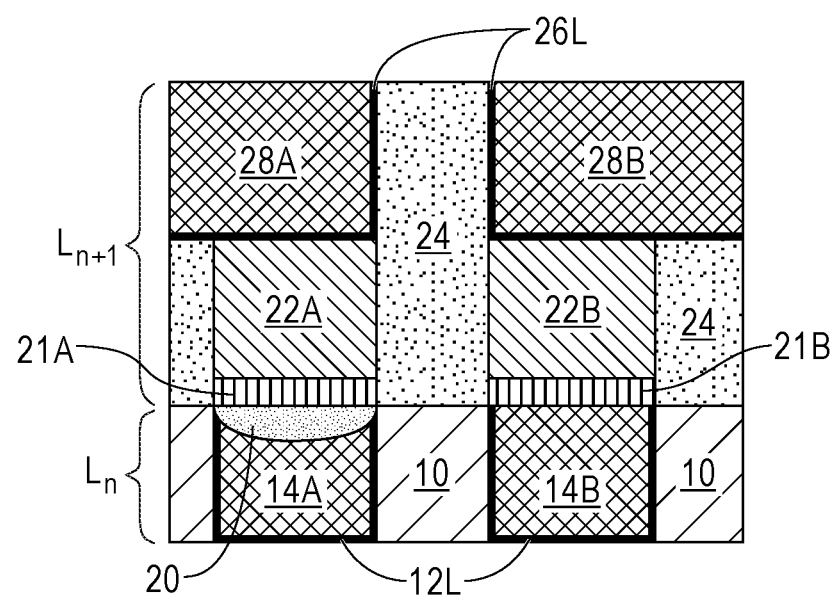
FIG. 9 is a cross sectional view of the exemplary structure of FIG. 8 after forming a second interconnect dielectric material layer laterally adjacent to, and atop, the patterned structure, and forming at least one second electrically conductive structure in the second interconnect dielectric material layer, wherein the at least one second electrically conductive structure contacts the patterned structure.

Referring now to FIG. 9, there is illustrated the exemplary structure of FIG. 8 after forming a second interconnect dielectric material layer 24 laterally adjacent to, and atop, the patterned structure (21A, 22A and 21B, 22B), and forming at least one second electrically conductive structure 28A in the second interconnect dielectric material layer 24, wherein the at least one second electrically conductive structure 28A contacts the patterned structure (21A, 22A) that is located on first metal-containing cap 20 that is present on the recessed surface 15 of the at least one first electrically conductive structure 14A. The second interconnect dielectric material layer 24 is also present on the first interconnect dielectric material layer 10.

The second interconnect dielectric material layer 24 includes one of the dielectric materials mentioned above for the first interconnect dielectric material layer 10. In one embodiment, the second interconnect dielectric material layer 24 may include a dielectric material that is compositionally the same as the dielectric material that provides the first interconnect dielectric material layer 10. In another embodiment, the second interconnect dielectric material layer 24 may include a dielectric material that is compositionally different from the dielectric material that provides the first interconnect dielectric material layer 10. The second interconnect dielectric material layer 24 can be formed utilizing one of the deposition processed mentioned above for forming the first interconnect dielectric material layer 10.

After forming the second interconnect dielectric material layer 24, at least one opening (not shown) is formed into the second interconnect dielectric material layer 24. Each opening that is formed physically exposes one of patterned structures. The openings can be formed by lithography and etching. A second diffusion barrier material can then be formed into each of the openings that is formed into the second interconnect dielectric material layer 24. The second diffusion barrier material includes one of the diffusion barrier materials mentioned above for providing the first diffusion barrier liner 12L. The second diffusion barrier material may be compositionally the same as, or compositionally different from the diffusion barrier material that provides the first diffusion barrier liner 12L. The second diffusion barrier material can be formed utilizing one of the deposition processes mentioned above for forming the diffusion barrier material that provides the first diffusion barrier liner 12L. The second diffusion barrier material can have a thickness within the range mentioned above for the diffusion barrier material that provides the first diffusion barrier liner 12L. In some embodiments, the second diffusion barrier material can be omitted.

In some embodiments, an optional plating seed layer (not specifically shown) as defined above can be formed on the surface of the second diffusion barrier material. In some embodiments, the optional plating seed layer is not needed.

Next, a second electrically conductive metal or metal alloy is formed into each opening and, if present, atop the second diffusion barrier material. The second electrically conductive metal or metal alloy provides the second electrically conductive structures 28A, 28B includes one of the electrically conductive metals or metal alloys mentioned above for providing the first electrically conductive structures 14A, 14B. In one embodiment, the second electrically conductive metal or metal alloy provides the second electrically conductive structures 28A, 28B is compositionally the same as the electrically conductive metal or metal alloy that provides the first electrically conductive structures 14A, 14B. In another embodiment, the second electrically conductive metal or metal alloy provides the second electrically conductive structures 28A, 28B is compositionally different from the electrically conductive metal or metal alloy that provides the first electrically conductive structures 14A, 14B. The second electrically conductive metal or metal alloy can be formed utilizing a deposition process such as, for example, CVD, PECVD, sputtering, chemical solution deposition or plating. In one embodiment, a bottom-up plating process is employed in forming the electrically conductive metal or metal alloy. In some embodiments, the second electrically conductive metal or metal alloy is formed above the topmost surface of the second interconnect dielectric material layer 24.

Following the deposition of the second electrically conductive metal or metal alloy, a planarization process such as, for example, chemical mechanical polishing (CMP) and/or grinding, can be used to remove all the second electrically conductive metal or metal alloy (i.e., overburden material) that is present outside each of the openings forming the second electrically conductive structures 28A, 28B. The planarization stops on a topmost surface of the second interconnect dielectric material layer 24. Thus, and if present, the planarization process also removes the second diffusion barrier material from the topmost surface of the second interconnect dielectric material layer 24. The remaining portion of the second diffusion barrier material that is present in the at least one opening is referred to herein as the second diffusion barrier liner 26L, while the remaining second electrically conductive metal or metal alloy that is present in the one opening may be referred to as the second electrically conductive structure 28A, 28B.

Collectively, the second interconnect dielectric material layer 24, the second electrically conductive structures 28A, 28B, if present, the second diffusion barrier liner 26L provide an upper (or second) interconnect level, $L_{n+1}$. The upper (or second) interconnect level, $L_{n-1}$, embeds the second electrically conductive structures 28A, 28B, if present, the second diffusion barrier liner 26L, the metal-containing structure 22A, 22B and the second metal-containing cap 21A, 21B therein. As shown, the topmost surface of the each second electrically conductive structure 28A, 28B is coplanar with a topmost surface of the second interconnect dielectric material layer 24, and, if present, a topmost surface of the second diffusion barrier liner 26L.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
   a first electrically conductive structure having a concave upper surface embedded in a first interconnect dielectric material layer;
   a first metal-containing cap having a convex bottom surface directly contacting the concave upper surface of the first electrically conductive structure, wherein the first metal-containing cap has a topmost surface that is coplanar with a topmost surface of the first interconnect dielectric material layer;
   a second metal-containing cap having a planar bottommost surface directly contacting the topmost surface of the first metal-containing cap;
   a metal-containing structure having a planar bottommost surface directly contacting a planar topmost surface of the second metal-containing cap;
   a second electrically conductive structure contacting a planar topmost surface of the metal-containing structure; and
   a second interconnect dielectric material layer present on the first interconnect dielectric material layer and located laterally adjacent to second metal-containing cap, the metal-containing structure, and the second electrically conductive structure.

2. The structure of claim 1, further comprising:
   at least one other first electrically conductive structure embedded in the first interconnect dielectric material layer and laterally adjacent to the first electrically conductive structure, wherein the at least one other first electrically conductive structure has a planar topmost surface;
   at least one other second metal-containing cap having a planar bottom surface directly contacting the planar topmost surface of the at least one other first electrically conductive structure;
   at least one other metal-containing structure having a planar bottommost surface directly contacting a planar topmost surface of the at least one other second metal-containing cap and a planar topmost surface; and
   at least one other second electrically conductive structure contacting the planar topmost surface of the at least one other metal-containing structure and embedded in the second interconnect dielectric material layer.

3. The structure of claim 2, wherein the planar topmost surface of the second metal-containing cap is coplanar with the planar topmost surface of the at least one other second metal-containing cap, the planar bottommost surface of the metal-containing structure is coplanar with the planar bottommost surface of the at least one another metal-containing structure, and the planar topmost surface of the metal-containing structure is coplanar with the planar topmost surface of the at least one another metal-containing structure.

4. The structure of claim 1, wherein both the first metal-containing cap and the second metal-containing cap are composed of a metal, a metal nitride or alloys of at least two metals, wherein said metal is selected from the group consisting of Ta, Ti, W, Co, Ru, and Rh.

5. The structure of claim 1, wherein the second metal-containing cap is compositionally different from the first metal-containing cap.

6. The structure of claim 1, wherein the metal-containing structure is composed of at least one electrically conductive metal-containing material or a stack of electrically conductive metal-containing materials.

7. The structure of claim 1, wherein the metal-containing structure is composed of a memory stack.

8. The structure of claim 7, wherein the memory stack comprises a ferroelectric memory (FE) stack, a resistive random access memory (ReRAM) stack, a magnetoresistive random access memory (MRAM) stack, or a phase change random access memory (PRAM) stack.

9. The structure of claim 1, wherein the metal-containing structure has outermost sidewalls that are vertically aligned to outermost sidewalls of the second metal-containing cap.

10. The structure of claim 1, wherein an interface between the metal-containing structure and the second metal-containing cap lacks any planarization impurities, while an interface between the first metal-containing cap and the second metal-containing cap contains planarization impurities.

* * * * *